United States Patent
Wu et al.

(10) Patent No.: US 12,379,636 B1
(45) Date of Patent: Aug. 5, 2025

(54) DISPLAY PANEL

(71) Applicant: AUO Corporation, Hsinchu (TW)

(72) Inventors: Chia-Jung Wu, Hsinchu (TW); Yueh-Chi Wu, Hsinchu (TW); Ti-Kuei Yu, Hsinchu (TW); Ya-Ling Hsu, Hsinchu (TW)

(73) Assignee: AUO CORPORATION, Hsinchu (TW)

( * ) Notice: Subject to any disclaimer, the term of this patent is extended or adjusted under 35 U.S.C. 154(b) by 0 days.

(21) Appl. No.: 18/826,250

(22) Filed: Sep. 6, 2024

(30) Foreign Application Priority Data

Apr. 8, 2024 (TW) .................. 113113009

(51) Int. Cl.
| | |
|---|---|
| *G02F 1/1362* | (2006.01) |
| *H01L 25/16* | (2023.01) |
| *H10D 86/40* | (2025.01) |
| *H10D 86/60* | (2025.01) |
| *H10H 20/857* | (2025.01) |

(52) U.S. Cl.
CPC ...... *G02F 1/136286* (2013.01); *H01L 25/167* (2013.01); *H10D 86/441* (2025.01); *H10D 86/60* (2025.01); *H10H 20/857* (2025.01)

(58) Field of Classification Search
CPC .... H10D 86/441; H10D 86/60; H10H 20/857; H01L 25/167; G02F 1/136286
See application file for complete search history.

(56) References Cited

U.S. PATENT DOCUMENTS

2024/0170494 A1* 5/2024 Fan .................. H10D 86/441

FOREIGN PATENT DOCUMENTS

| CN | 115273676 A | 11/2022 |
|---|---|---|
| CN | 115273677 A | 11/2022 |

\* cited by examiner

*Primary Examiner* — Kevin Quarterman
(74) *Attorney, Agent, or Firm* — WPAT, PC

(57) ABSTRACT

A display panel includes a substrate, a first circuit routing area, a second circuit routing area, a plurality of first gate lines, a plurality of second gate lines, a plurality of first drive lines and a plurality of second drive lines. Each of the first gate lines and one of the second gate lines intersect at a first intersect point. Each of the first drive lines and one of the second drive lines electrically connect at a second intersect point. The distance on the first direction between one of the first intersect points and one of the second intersect points on the second direction is smaller than the width of a liquid crystal subpixel on the first direction.

15 Claims, 21 Drawing Sheets

DISPLAY PANEL

RELATED APPLICATIONS

This application claims priority to Taiwan Application Serial Number 113113009, filed Apr. 8, 2024, which is herein incorporated by reference.

BACKGROUND

Field of Invention

The present disclosure relates to a display panel.

Description of Related Art

In the field of large scale display, splicing screen is generally used to achieve large scale display. However, although the boarder of traditional bistable liquid crystal display is already extremely narrow, when multiple liquid crystal display are spliced, the gap of splicing is still visible, which cause the distortion of the image.

A general solution of this is to add micro light-emitting diode (pLED) on the boarder of the liquid crystal display, such that the boarder can also display image to achieve the effect of the continuity of image. However, such design would lead to the problem that the liquid crystal subpixel driven by voltage and the pLED driven by current exist on the display panel simultaneously, which need a special electrical circuit structure to drive two different kinds of light-emitting module while taking light-emitting efficiency into account.

SUMMARY

One aspect of the present disclosure provides a display panel.

According to one embodiment of the present disclosure, a display panel includes a substrate, a first circuit routing area, a second circuit routing area, a plurality of first gate lines, a plurality of second gate lines, a plurality of first drive lines and a plurality of second drive lines. The substrate has a liquid crystal display area and a LED display area, in which a plurality of light emitting diodes (LED) are disposed in the LED display area. The liquid crystal display area is disposed with a plurality of liquid crystal subpixels and three of the liquid crystal subpixels form a pixel. The first circuit routing area is adjacent to a first side of the LED display area of the substrate. The second circuit routing area is adjacent to a second side opposite to the first side of the LED display area of the substrate. The first gate lines are arranged along a first direction and are electrically connected to the first circuit routing area or the second circuit routing area. The second gate lines are arranged along a second direction, in which the second direction is different than the first direction. Each of the first gate lines and one of the second gate lines intersect at a first intersect point. Each of the second gate lines electrically connects one of the first gate lines. The first drive lines are arranged along the first direction and are electrically connected to the first circuit routing area or the second circuit routing area and the LEDs. The second drive lines are arranged along the second direction, in which each of the second drive lines electrically connects one of the first drive lines. Each of the first drive lines and one of the second drive lines electrically connects at a second intersect point. A distance on the first direction between one of the first intersect points and one of the second intersect points on the first direction is smaller than a width of the liquid crystal subpixel on the first direction, or a distance on the first direction between two of the second intersect points on the first direction is smaller than a width of the liquid crystal subpixel on the first direction.

In some embodiment of the present disclosure, a distance on the first direction between every of the first intersect points and one of the second intersect points on the first direction respectively is smaller than a width of the liquid crystal subpixel on the first direction.

In some embodiment of the present disclosure, the first drive lines has a first portion and a second portion, the second drive lines has a first portion and a second portion, each of the first portion of the first drive lines electrically connects one of the first portion of the second drive lines and the LEDs on a side in a same row.

In some embodiment of the present disclosure, a distance on the first direction between every of the second intersect point and another one of the second intersect point on the first direction is smaller than a width of the liquid crystal subpixel on the first direction.

In some embodiment of the present disclosure, the first drive lines has a first portion and a second portion, the second drive lines has a first portion and a second portion, the first portion of the second drive lines electrically connects the first circuit routing area through the first portion of the first drive lines, and the second portion of the second drive lines electrically connects the second circuit routing area through the second portion of the first drive lines.

In some embodiment of the present disclosure, a width between each of the first intersect point and another one of the first intersect point respectively on the first direction is smaller than the width of the liquid crystal subpixel on the first direction.

In some embodiment of the present disclosure, the first gate lines and the first drive lines are located between the pixels.

In some embodiment of the present disclosure, the display panel further includes a plurality of data lines. The data lines are located between the liquid crystal subpixels and the substrate, in which the data lines extend along a center line of the liquid crystal subpixels.

Another aspect of the present disclosure provides a display panel.

According to one embodiment of the present disclosure, a display panel includes a substrate, a plurality of liquid crystal subpixels, a circuit routing area, a plurality of first gate lines, a plurality of second gate lines, a plurality of first drive lines, a plurality of second drive lines and a plurality of third drive lines. The substrate has a liquid crystal display area and a LED display area, in which a plurality of light emitting diodes (LED) are disposed in the LED display area. The LED display area surrounds the liquid crystal display area. The liquid crystal subpixels are located in the liquid crystal display area of the substrate. The circuit routing area is adjacent to a first side of the LED display area of the substrate. The first gate lines are located in the liquid crystal display area, arranged along a first direction and electrically connected to the circuit routing area. The second gate lines pass through the liquid crystal display area, are arranged along a second direction, in which the second direction is different from the first direction. Each of the second gate lines electrically connects one of the first gate lines. The first drive lines are located in the liquid crystal display area, arranged along the first direction and electrically connected to the circuit routing area. The second drive lines pass through the liquid crystal display area, are arranged along the second direction and are electrically connected to a first portion of the LEDs, in which each of the second drive lines electrically connects one of the first drive lines. The third drive lines are located in the liquid crystal display area, arranged along the first direction and electrically connected to a second portion of the LEDs, in which a first distance is between each of the third drive lines and a left boarder of one of the liquid crystal subpixel that is closest to a position of the third drive line, a second distance is between each of the first drive lines and a left boarder of one of the liquid crystal subpixel that is closest to a position of the first drive line, a third distance is between each of the first gate lines and a left boarder of one of the liquid crystal subpixel that is closest to a position of the first gate line, and the first distance, the second distance and the third distance are all greater or smaller than a width of every of the liquid crystal subpixel on the first direction.

In some embodiment of the present disclosure, the first distance, the second distance and the third distance is half of the width of every of the liquid crystal subpixel on the first direction.

In some embodiment of the present disclosure, every of the third drive lines is located between one of the first gate lines and one of the first drive lines.

In some embodiment of the present disclosure, the first drive line has a first portion and a second portion, the second drive line has a first portion and a second portion, every of the first portion of the first drive line electrically connects one of the first portion of the second drive line and the LEDs on a side in a same row.

In some embodiment of the present disclosure, the second distance is the same as the third distance, and the first distance is smaller than the third distance.

In some embodiment of the present disclosure, the display panel further includes a plurality of data lines. The data lines are located between the liquid crystal subpixels and the substrate, in which the data lines extend along a center line of the liquid crystal subpixels.

In some embodiment of the present disclosure, the display panel further includes a plurality of fourth drive lines. The fourth drive lines are located in the LED display area and electrically connected to the circuit routing area and a third portion of the LEDs.

In the aforementioned embodiments of the present disclosure, since a distance between one of the first drive lines and one of the first gate lines on the first direction is smaller than a width of the liquid crystal subpixel on the first direction, or a distance between two of the first drive lines on the first direction is smaller than a width of the liquid crystal subpixel on the first direction, the area of the wiring on the display panel is decreased, which makes the display panel to simultaneously drive the current-drived LED and the voltage-drived liquid crystal subpixel while taking light transmittance efficiency into account, which improves the competitiveness of the product.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
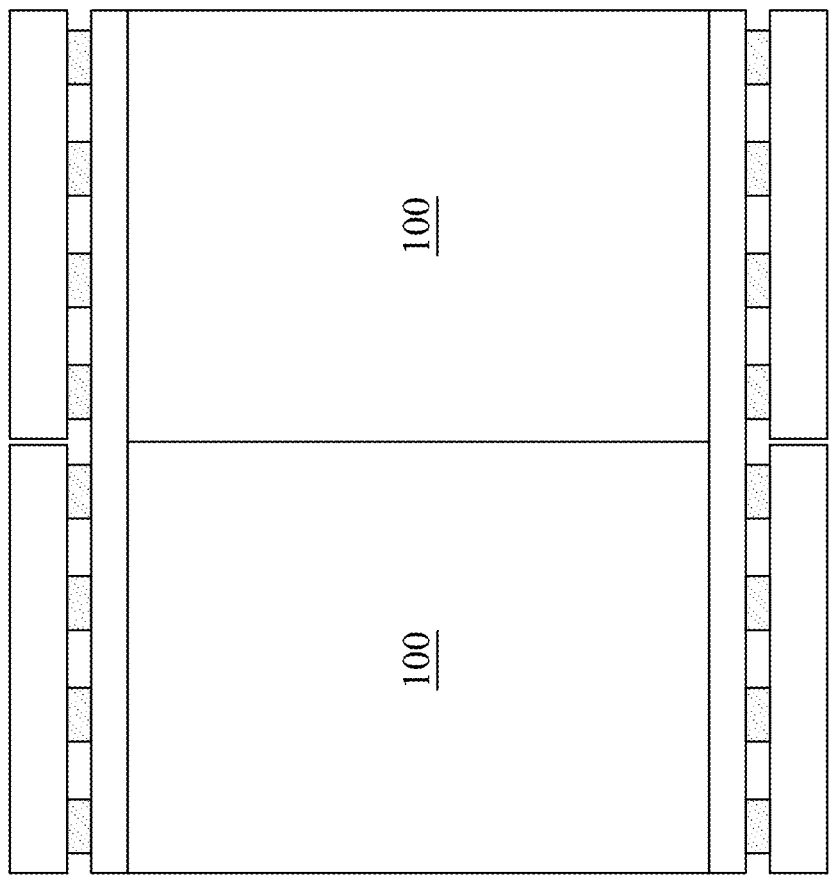
FIG. 1 is a top view of a spliced display according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
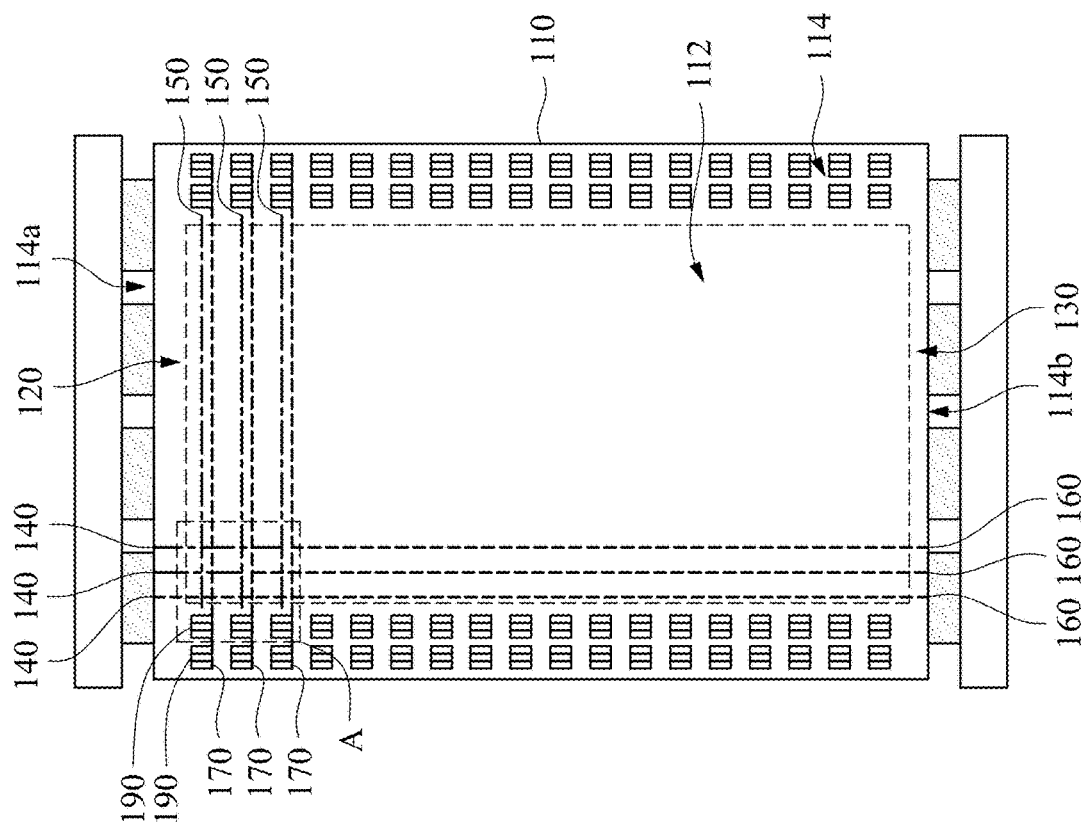
FIG. 2 is a top view of the display panel of FIG. 1.

FIG. 1 is a top view of a spliced display 200 according to one embodiment of the present disclosure. FIG. 2 is a top view of the display panel 100 of FIG. 1. Refer to FIG. 1 and FIG. 2, the display panel 100 can be one of the display panels of the spliced display 200. The number of the display panel 100 in FIG. 1 is merely an example, and it is not used to limit the disclosure. A display panel 100 includes a substrate 110, a first circuit routing area 120, a second circuit routing area 130, a plurality of first gate lines 140, a plurality of second gate lines 150, a plurality of first drive lines 160 and a plurality of second drive lines 170. The substrate has a liquid crystal display area 112 and a LED display area 114, in which the liquid crystal display area 112 is located in the range confined by the dashed line in FIG. 2, the LED display area 114 is located outside range confined by the dashed line in FIG. 2. Pixels 190 consist of a plurality of LEDs are disposed in the LED display area 114. The first circuit routing area 120 is adjacent to a first side 114a of the LED display area 114 of the substrate 110. The second circuit routing area 130 is adjacent to a second side 114b of the LED display area 114 of the substrate 110, and the second side 114b is opposite to the first side 114a. The first gate lines 140 are arranged along a first direction D1 (such as parallel arranged). In the present embodiment, the first gate lines 140 are electrically connected to the first circuit routing area 120. The second gate lines 150 are arranged along a second direction D2. The second direction D2 is different than the first direction D1. In some embodiments, the second direction D2 is perpendicular to the first direction D1. Each of the second gate lines 150 electrically connects one of the first gate lines 140. The first drive lines 160 are arranged along the first direction D1. In the present embodiment, the first drive lines 160 are electrically connected to the second circuit routing area 130. The second drive lines 170 are arranged along the second direction D2. Each of the second drive lines 170 electrically connects one of the first drive lines 160. In the following description, the first gate lines 140, the second gate lines 150, the first drive lines 160 and the second drive lines 170 are described. Moreover, in the present embodiment, the display panel further includes a plurality of liquid crystal subpixels 182 and a plurality of LEDs 192. The LEDs 192 can be micro light-emitting diodes (pLED). Three adjacent LEDs 192 combine into a pixel 190. The liquid crystal subpixels 182 is located in the liquid crystal display area 112, and three adjacent liquid crystal subpixels 182 combine into a pixel 180.

Figure 3:
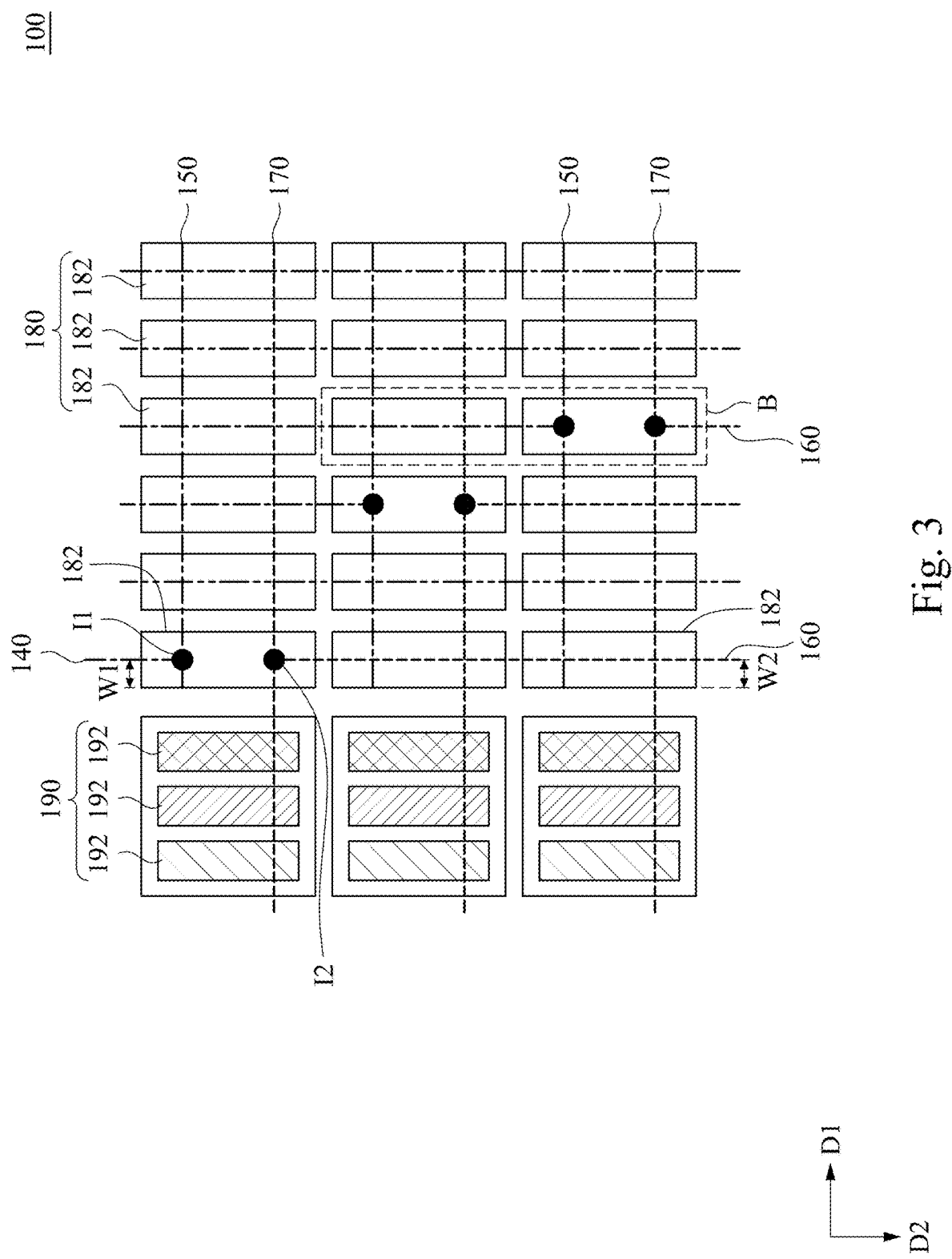
FIG. 3 is a local enlarged view of the range confined by the dashed line A of the display panel of FIG. 2.
Figure 4:
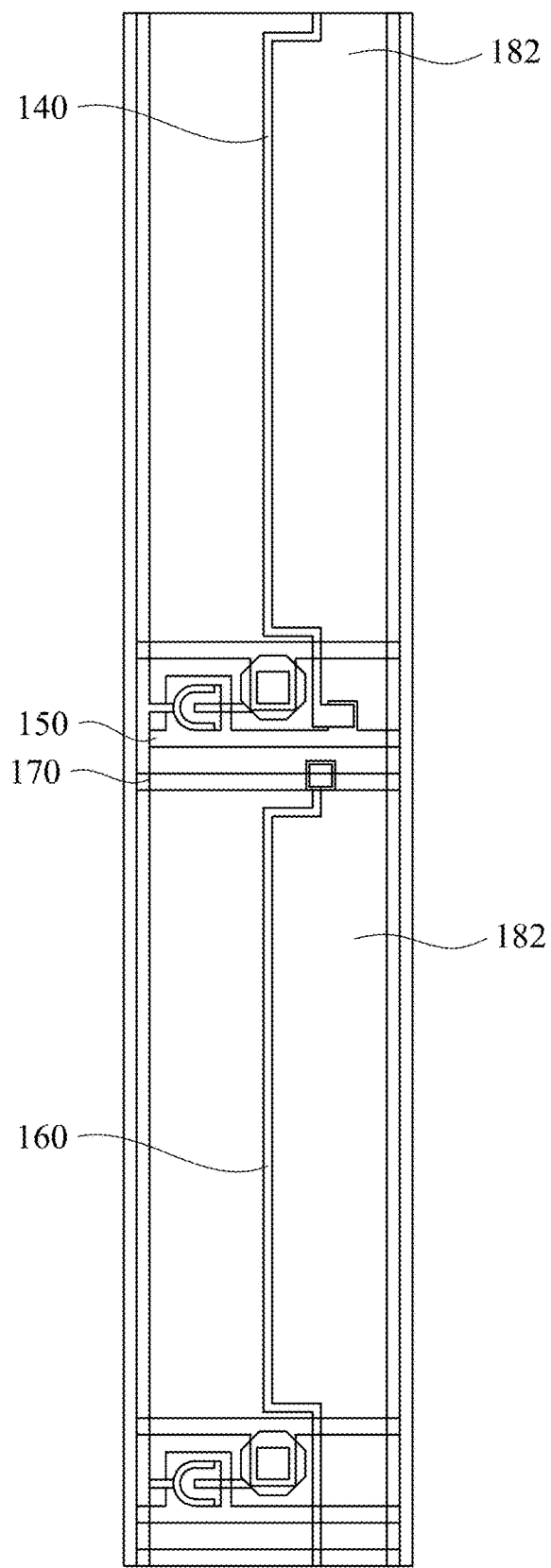
FIG. 4 is a local enlarged view of the range confined by the dashed line B of the display panel of FIG. 3.

FIG. 3 is a local enlarged view of the range confined by the dashed line A of the display panel 100 of FIG. 2. FIG. 4 is a local enlarged view of the range confined by the dashed line B of the display panel 100 of FIG. 3. Refer to FIG. 3 and FIG. 4, in the present embodiment, the first gate lines 140 and the second gate lines 150 intersect at first intersect points 11 respectively. The first drive lines 160 and the second drive lines 170 intersect at second intersect points 12 respectively. A distance between one of the first intersect points 11 (such as the first intersect point 11 at the leftmost of FIG. 3) and one of the second intersect points 12 (such as the second intersect point 12 at the leftmost of FIG. 3) on the first direction D1 is smaller than a width of the liquid crystal subpixel 182 on the first direction D1, which means that the first intersect points 11 and the second intersect points 12 are roughly aligned on the second direction D2. In the present embodiment, the first gate lines 140 extend along the central line of the liquid crystal subpixel 182, in which the central line of the liquid crystal subpixel 182 is the central line along the longitudinal direction of the liquid crystal subpixel 182. The first drive lines 160 extend along the central line of the liquid crystal subpixel 182. In other words, a first distance W1 between the first gate line 140 and the left boarder of the liquid crystal subpixel 182 closest in position is half of the width of the liquid crystal subpixel 182. A second distance W2 between the first drive line 160 and the left boarder of the liquid crystal subpixel 182 closest in position is half of the width of the liquid crystal subpixel 182, which means the first distance W1 and the second distance W2 are the same.

Refer to FIG. 2 and FIG. 3, in the present embodiment, each of the second drive lines 170 electrically connects the LEDs 192 at the two sides of the display panel. Since there are two columns of pixels 190 consist of LEDs 192 on each side respectively and three LEDs 192 combine into a pixel 190, each of the second drive lines 170 electrically connects and drives the LEDs 192 at two sides, such as the twelve LEDs 192 at two sides in FIG. 2, but the number is not used to limited the disclosure. In practical application, to increase the aperture ratio of the liquid crystal subpixel 182, the first gate lines 140 and the first drive lines 160 will located under the trunk black area of the polymer sustained alignment (PSA) of the liquid crystal subpixel 182.

Since a distance between one of the first drive lines 160 and one of the first gate lines 140 on the first direction D1 is smaller than a width of the liquid crystal subpixel 182 on the first direction D1, or a distance between two of the first drive lines 160 on the first direction D1 is smaller than a width of the liquid crystal subpixel 182 on the first direction D1, the area of the wiring on the display panel 100 is decreased, which makes the display panel 100 to simultaneously drive the current-drived LED 192 and the voltage-drived liquid crystal subpixel 182 while taking light transmittance efficiency into account, which improves the competitiveness of the product.

Figure 5:
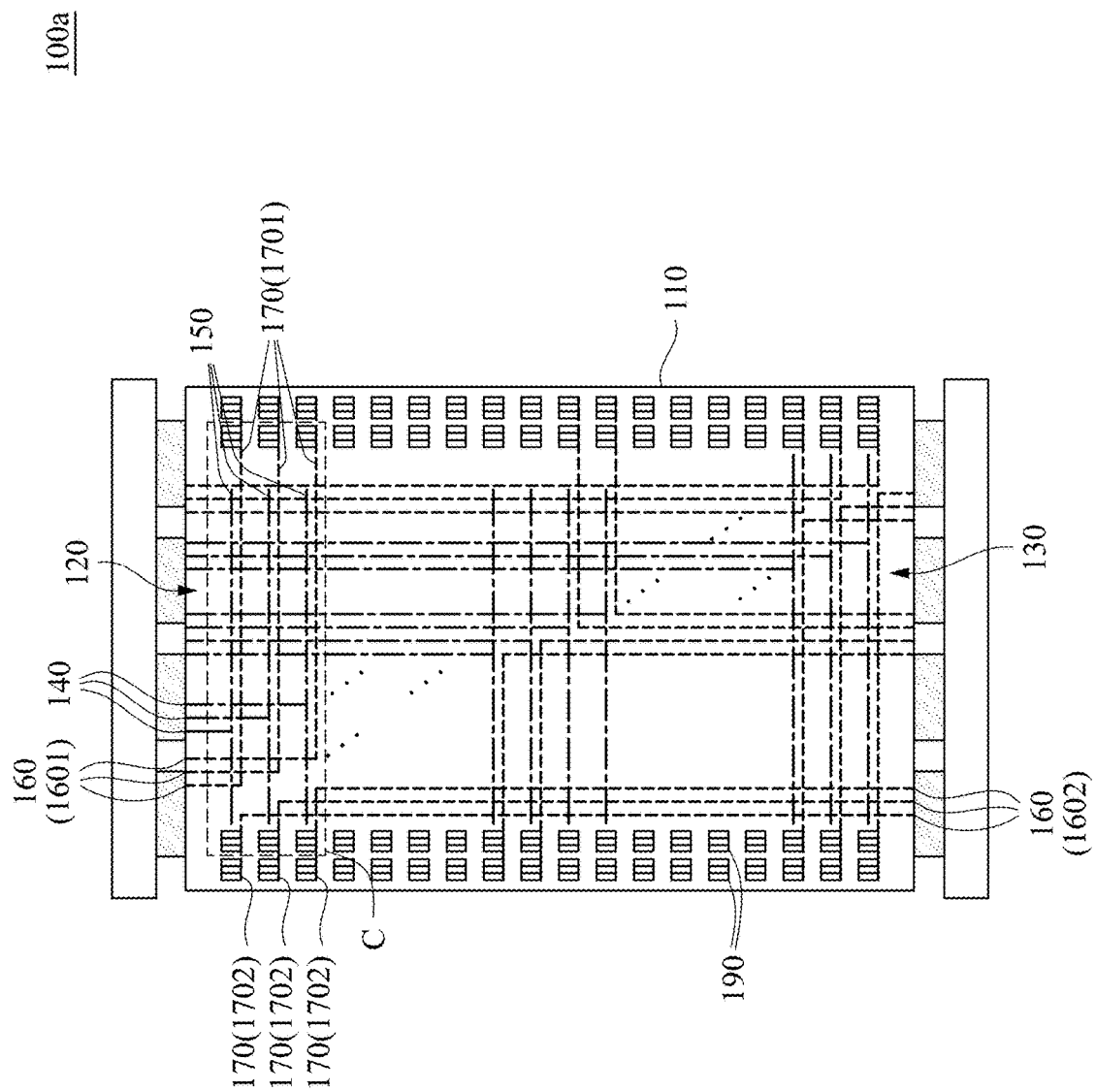
FIG. 5 is a top view of the display panel according to another embodiment of the present disclosure.
Figure 6A:
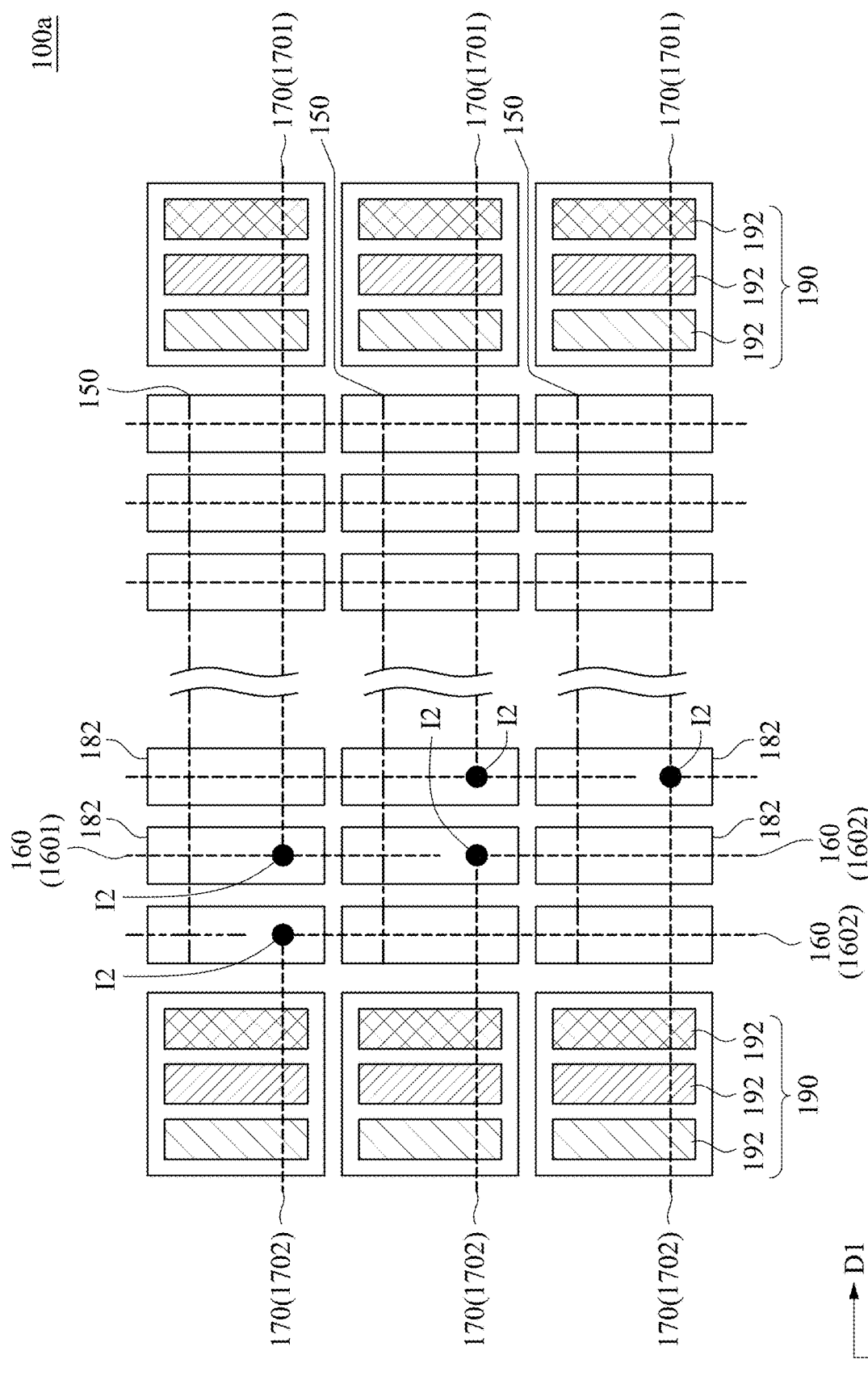
FIG. 6A is a local enlarged view of the range confined by the dashed line C of the display panel of FIG. 5.
Figure 6B:
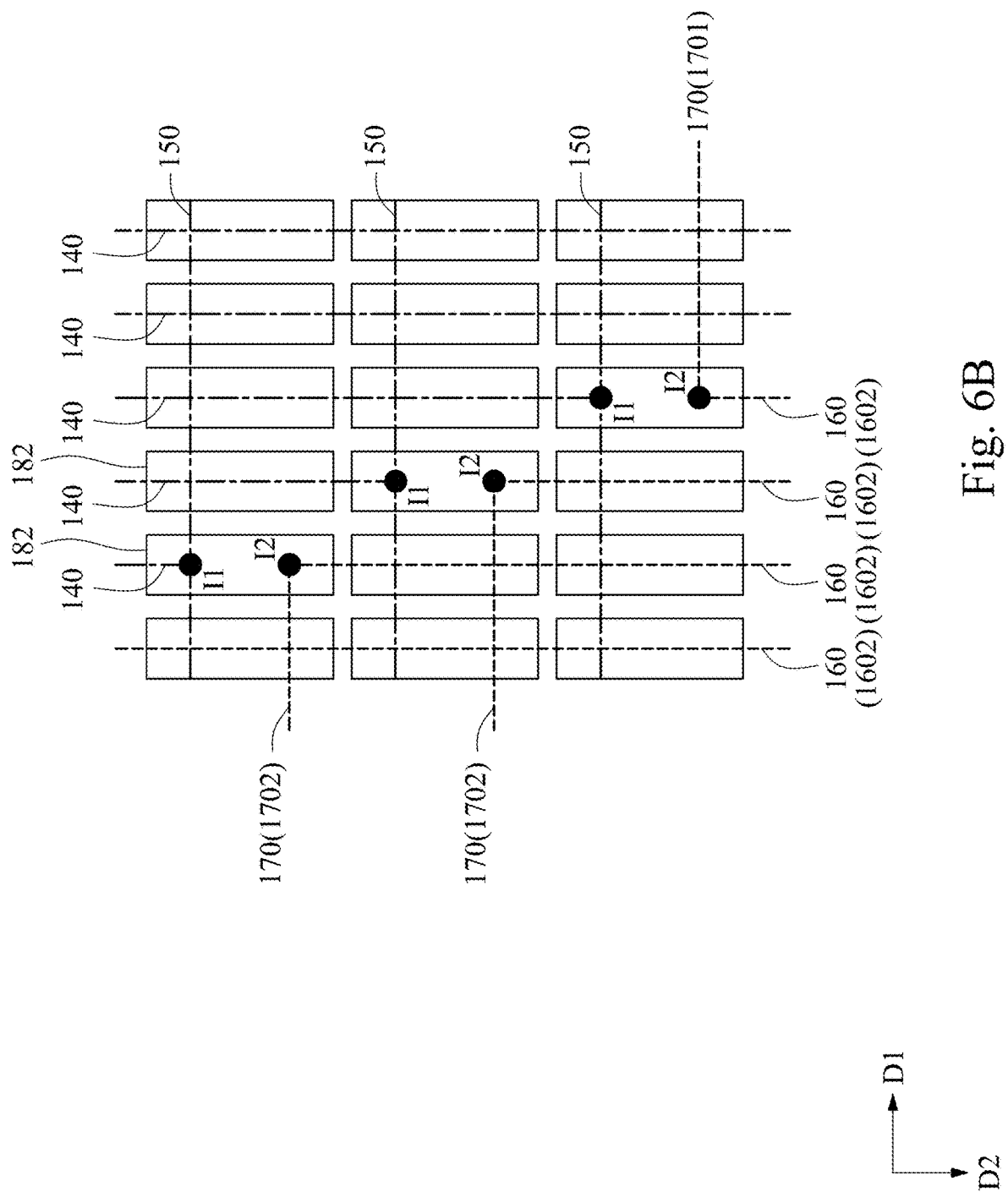
FIG. 6B is a local enlarged view of the central area of the display panel of FIG. 5.

FIG. 5 is a top view of the display panel 100a according to another embodiment of the present disclosure. FIG. 6A is a local enlarged view of the range confined by the dashed line C of the display panel 100a of FIG. 5. Refer to FIG. 5 and FIG. 6A, a display panel 100a includes a substrate 110, a first circuit routing area 120, a second circuit routing area 130, a plurality of first gate lines 140, a plurality of second gate lines 150, a plurality of first drive lines 160 and a plurality of second drive lines 170. The difference between the present embodiment and the embodiment of FIG. 2 is that, in the present embodiment, a distance between every of the second intersect point 12 and another one of the second intersect point 12 on the first direction D1 is smaller than a width of the liquid crystal subpixel 182 on the first direction D1. In addition, as the central area of FIG. 5 shown in FIG. 6B, a distance between every of the first intersect point 11 and one of the second intersect point 12 on the first direction D1 is smaller than a width of the liquid crystal subpixel 182 on the first direction D1. Moreover, the first drive lines 160 has a first portion 1601 (see FIG. 6A) and a second portion 1602, the second drive lines 170 has a first portion 1701 and a second portion 1702, the first portion 1701 of the second drive lines 170 electrically connects the first circuit routing area 120 through the first portion 1601 of the first drive lines 160, and the second portion 1702 of the second drive lines 170 electrically connects the second circuit routing area 130 through the second portion 1602 of the first drive lines 160. Moreover, in the present embodiment, each of the second drive lines 170 electrically connects the LEDs 192 on one side of the display panel 100a. Since there are two columns of pixels 190 consist of LEDs 192 on each side respectively and three LEDs 192 combine into a pixel 190, each of the second drive lines 170 electrically connects and drives six LEDs 192.

Figure 7:
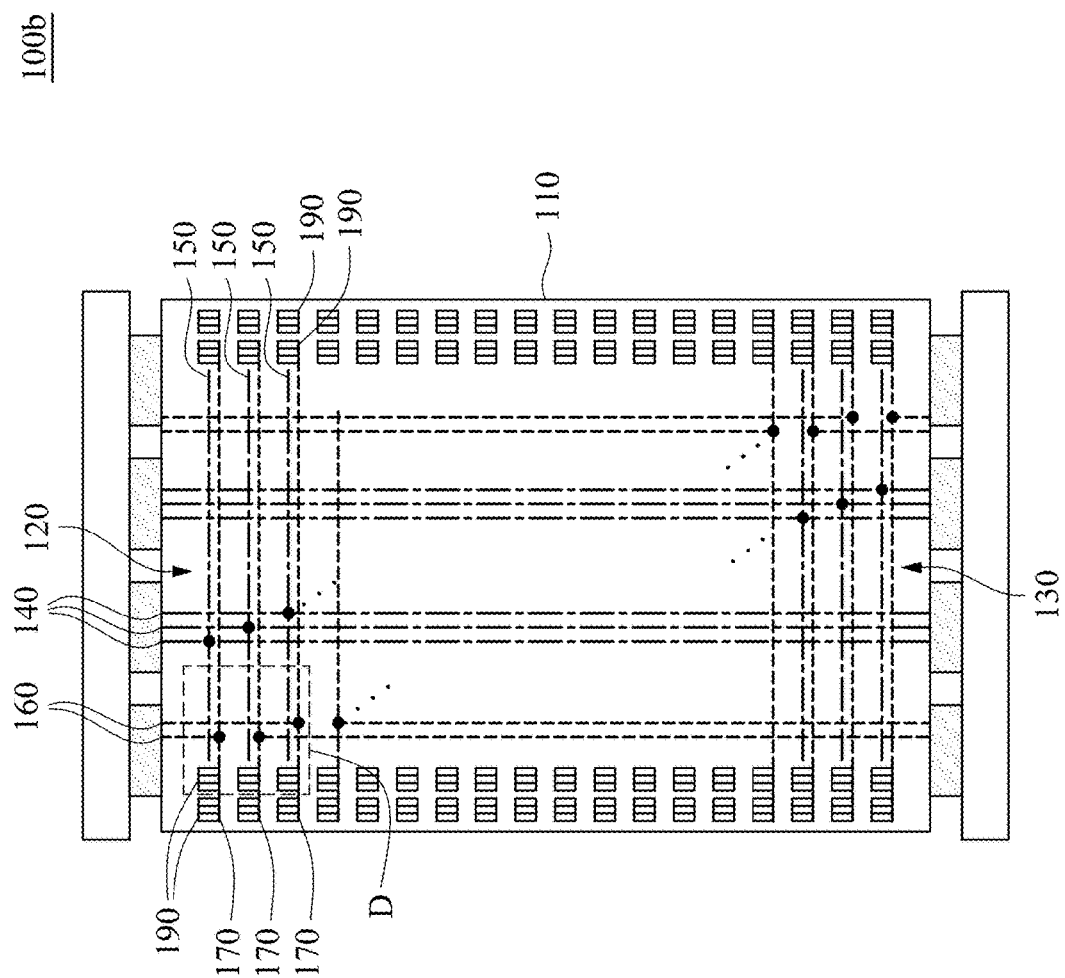
FIG. 7 is a top view of the display panel according to yet another embodiment of the present disclosure.
Figure 8:
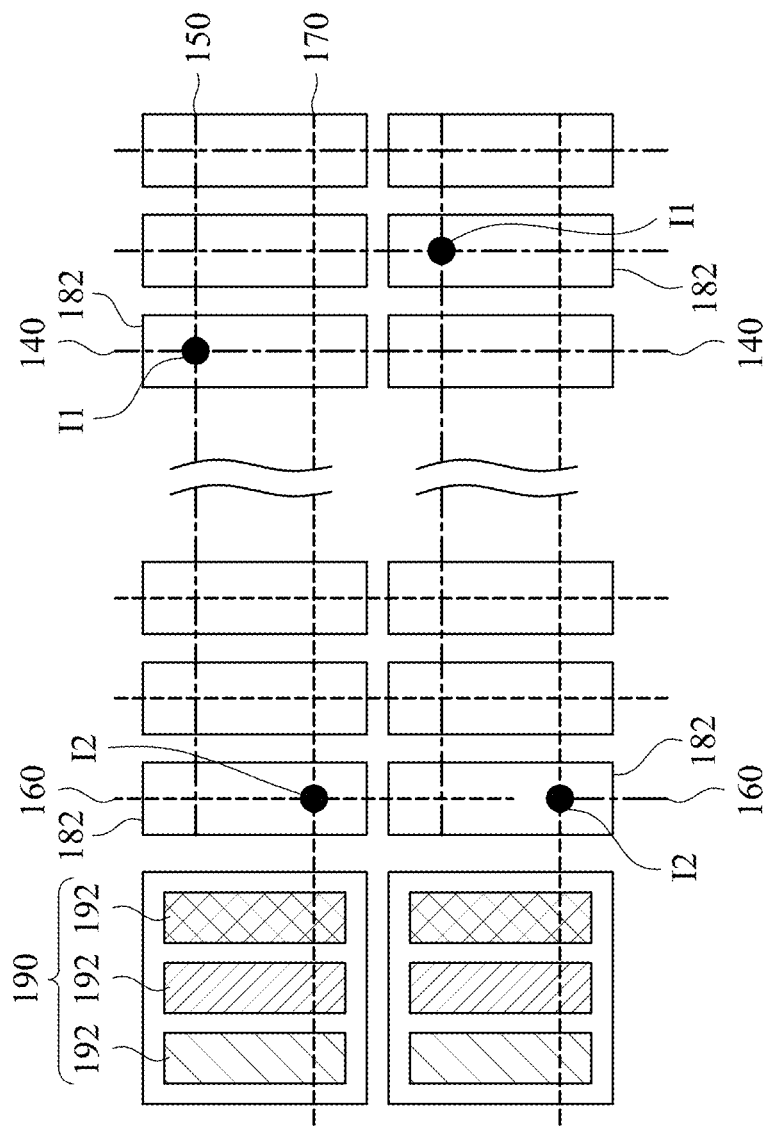
FIG. 8 is a local enlarged view of the range confined by the dashed line D of the display panel of FIG. 7.

FIG. 7 is a top view of the display panel 100b according to yet another embodiment of the present disclosure. FIG. 8 is a local enlarged view of the range confined by the dashed line D of the display panel 100b of FIG. 7. Refer to FIG. 7 and FIG. 8, a display panel 100b includes a substrate 110, a first circuit routing area 120, a second circuit routing area 130, a plurality of first gate lines 140, a plurality of second gate lines 150, a plurality of first drive lines 160 and a plurality of second drive lines 170. The difference between the present embodiment and the embodiment of FIG. 5 is that, in the present embodiment, a width between each of the first intersect point 11 and another one of the first intersect point 11 respectively on the first direction D1 is smaller than the width of the liquid crystal subpixel 182 on the first direction D1. Moreover, in the present embodiment, each of the second drive lines 170 electrically connects and drives the LEDs 192 at two sides of the display panel 100b. Since there are two columns of pixels 190 consist of LEDs 192 on each side respectively and three LEDs 192 combine into a pixel 190, each of the second drive lines 170 electrically connects and drives LEDs 192 on two sides.

Figure 9:
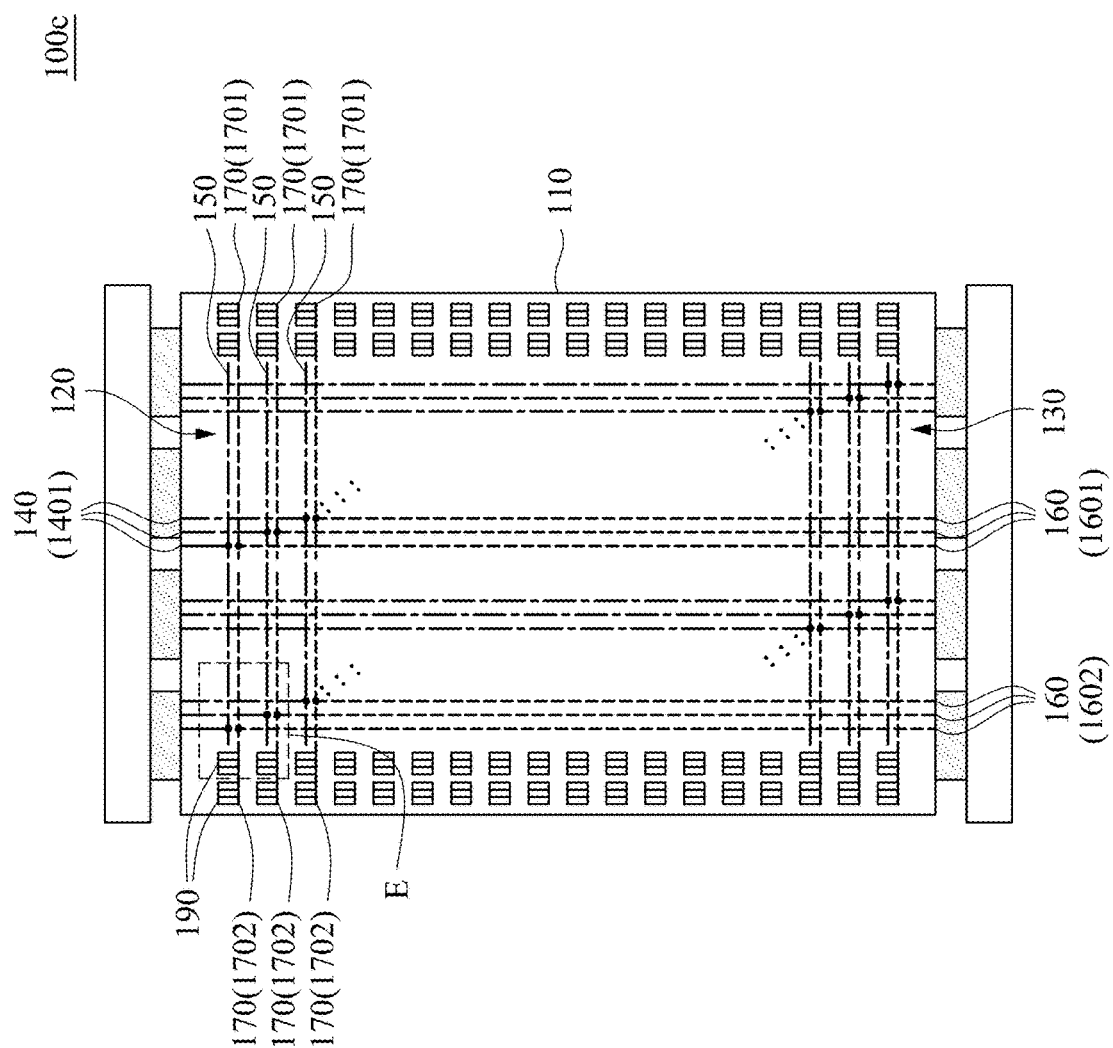
FIG. 9 is a top view of the display panel according to yet another embodiment of the present disclosure.
Figure 10:
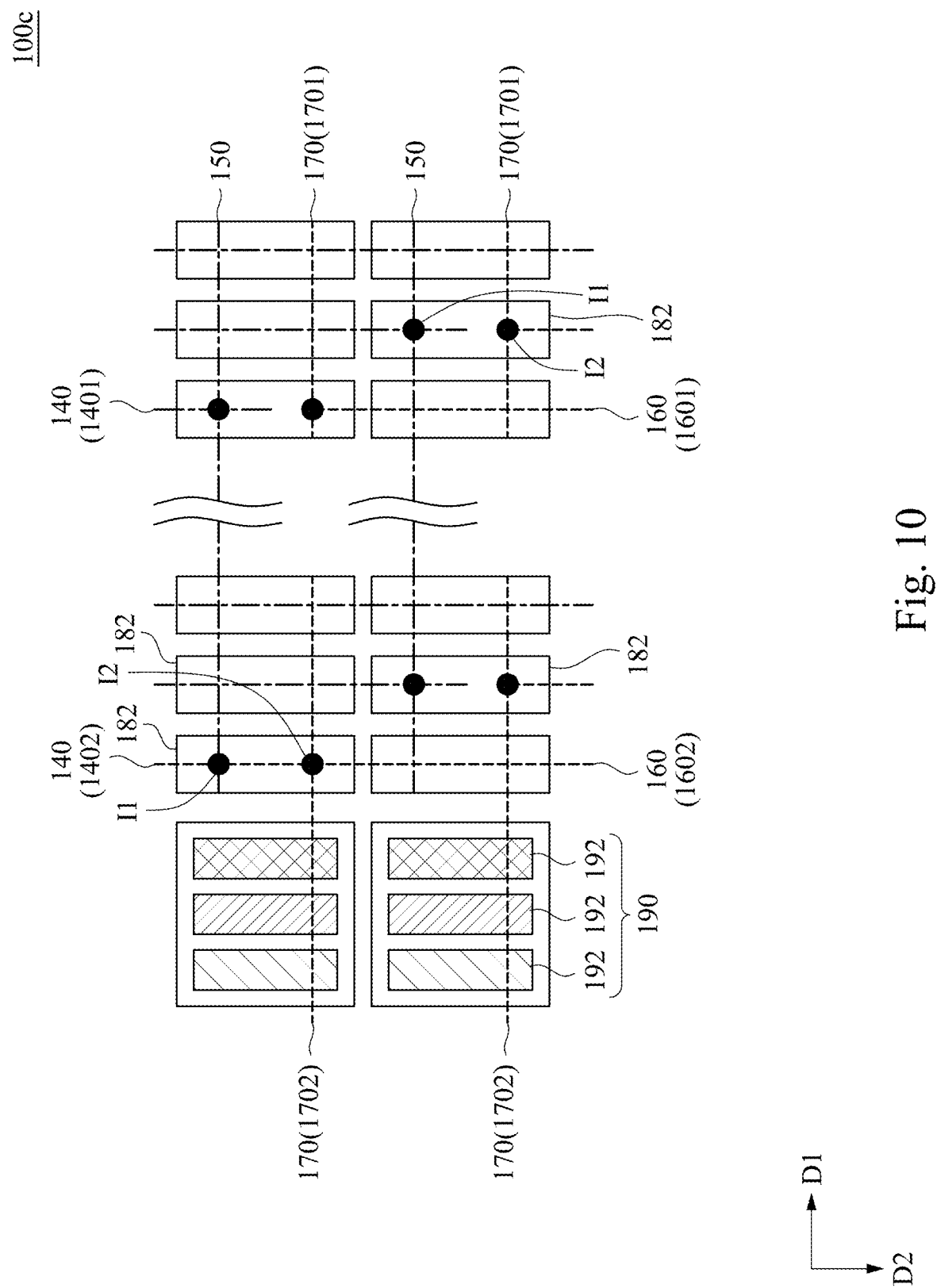
FIG. 10 is a local enlarged view of the range confined by the dashed line E of the display panel of FIG. 9.

FIG. 9 is a top view of the display panel 100c according to yet another embodiment of the present disclosure. FIG. 10 is a local enlarged view of the range confined by the dashed line E of the display panel 100c of FIG. 9. Refer to FIG. 9 and FIG. 10, a display panel 100c includes a substrate 110, a first circuit routing area 120, a second circuit routing area 130, a plurality of first gate lines 140, a plurality of second gate lines 150, a plurality of first drive lines 160 and a plurality of second drive lines 170. The difference between the present embodiment and the embodiment of FIG. 3 is that, in the present embodiment, the first drive lines 160 has a first portion 1601 and a second portion 1602, the second drive lines 170 has a first portion 1701 and a second portion 1702, each of the first portion 1601 of the first drive lines 160 electrically connects one of the first portion 1701 of the second drive lines 170 and the LEDs 192 on a side in a same row, such as six LEDs 192 on a side in the same row in FIG. 9, but the number is not used to limit the disclosure. In addition, the first gate lines 140 has a first portion 1401 and a second portion 1402, the first portion 1401 of the first gate lines 140 electrically connects one of the second gate lines 150. Moreover, in the present embodiment, each of the second drive lines 170 electrically connects the LEDs 192 on one side of the display panel 100c. Since there are two columns of pixels 190 consist of LEDs 192 on each side respectively and three LEDs 192 combine into a pixel 190, each of the second drive lines 170 electrically connects and drives six LEDs 192.

Figure 11:
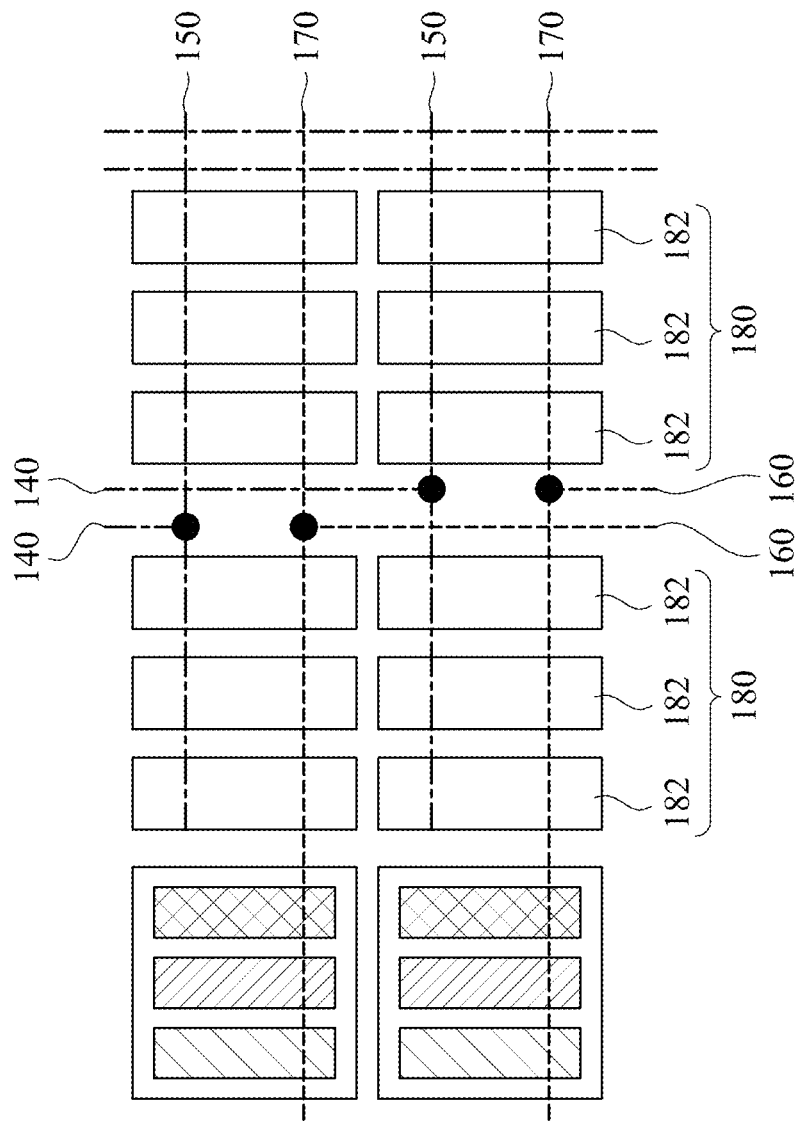
FIG. 11 is a top view of the display panel according to yet another embodiment of the present disclosure.

FIG. 11 is a top view of the display panel 100d according to yet another embodiment of the present disclosure. Refer to FIG. 11, a display panel 100c includes a plurality of first gate lines 140, a plurality of second gate lines 150, a plurality of first drive lines 160 and a plurality of second drive lines 170. In addition, the display panel further includes a plurality of liquid crystal subpixels 182. The liquid crystal subpixels 182 are located in the liquid crystal display area 112 and three of the liquid crystal subpixels 182 combine into a pixel 180. The difference between the present embodiment and the embodiment of FIG. 3 is that, in the present embodiment, the first gate lines 140 and the first drive lines 160 of the display panel 100c are located between the adjacent two pixels 180.

Figure 12:
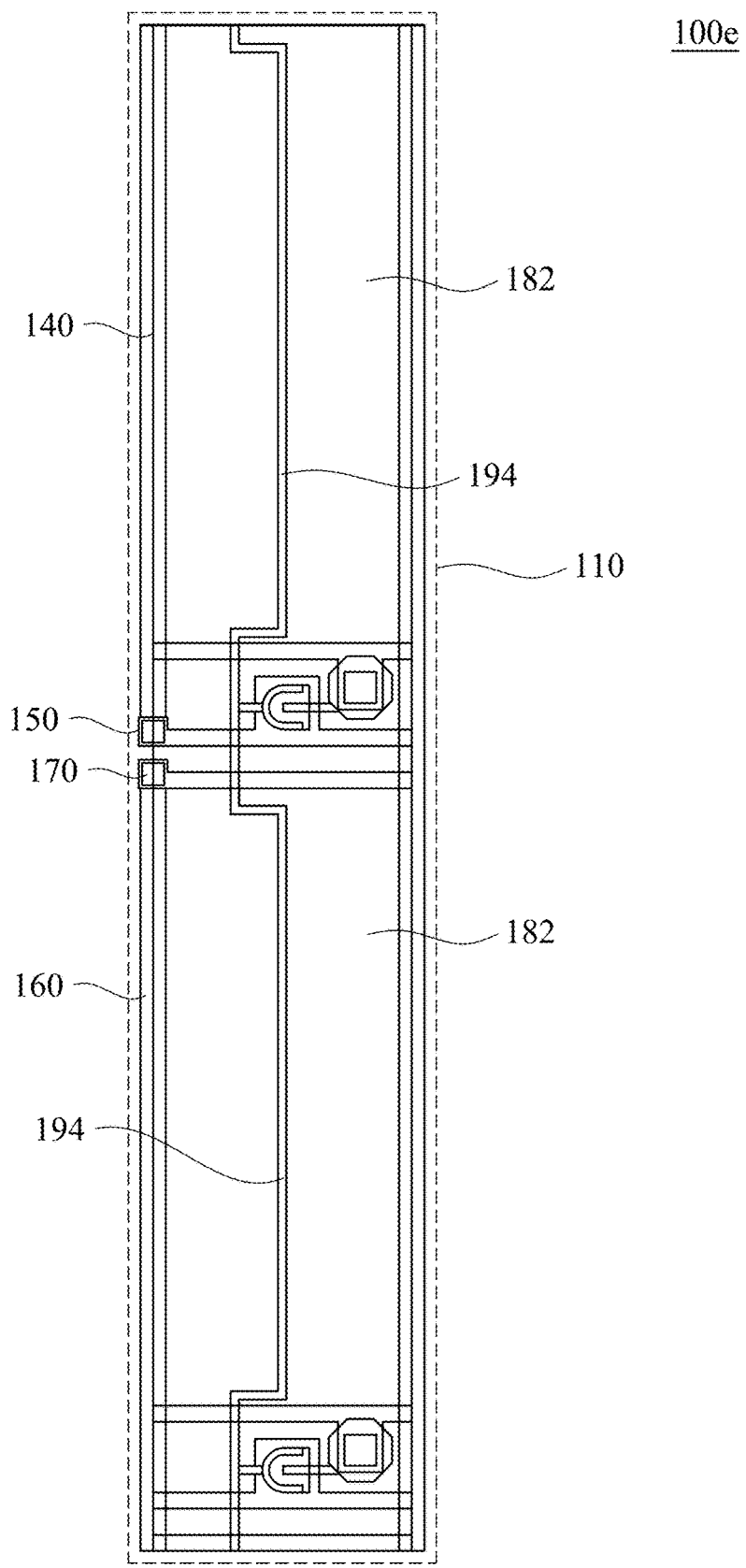
FIG. 12 is a local enlarged view of the liquid crystal subpixels of the display panel according to yet another embodiment of the present disclosure.

FIG. 12 is a local enlarged view of the liquid crystal subpixels 182 of the display panel 100e according to yet another embodiment of the present disclosure. Refer to FIG. 12, a display panel 100e includes a plurality of first gate lines 140, a plurality of second gate lines 150, a plurality of first drive lines 160, a plurality of second drive lines 170 and a plurality of liquid crystal subpixels 182. The difference between the present embodiment and the embodiment of FIG. 4 is that, in the present embodiment, the display panel 100e further includes a plurality of data lines 194. The data lines 194 are located on the substrate 110 and the liquid crystal subpixels 182 are located on the data lines 194, such that the data lines 194 are located between the liquid crystal subpixels 182 and the substrate 110, in which the data lines 194 extend along a center line of the liquid crystal subpixels 182.

Figure 13:
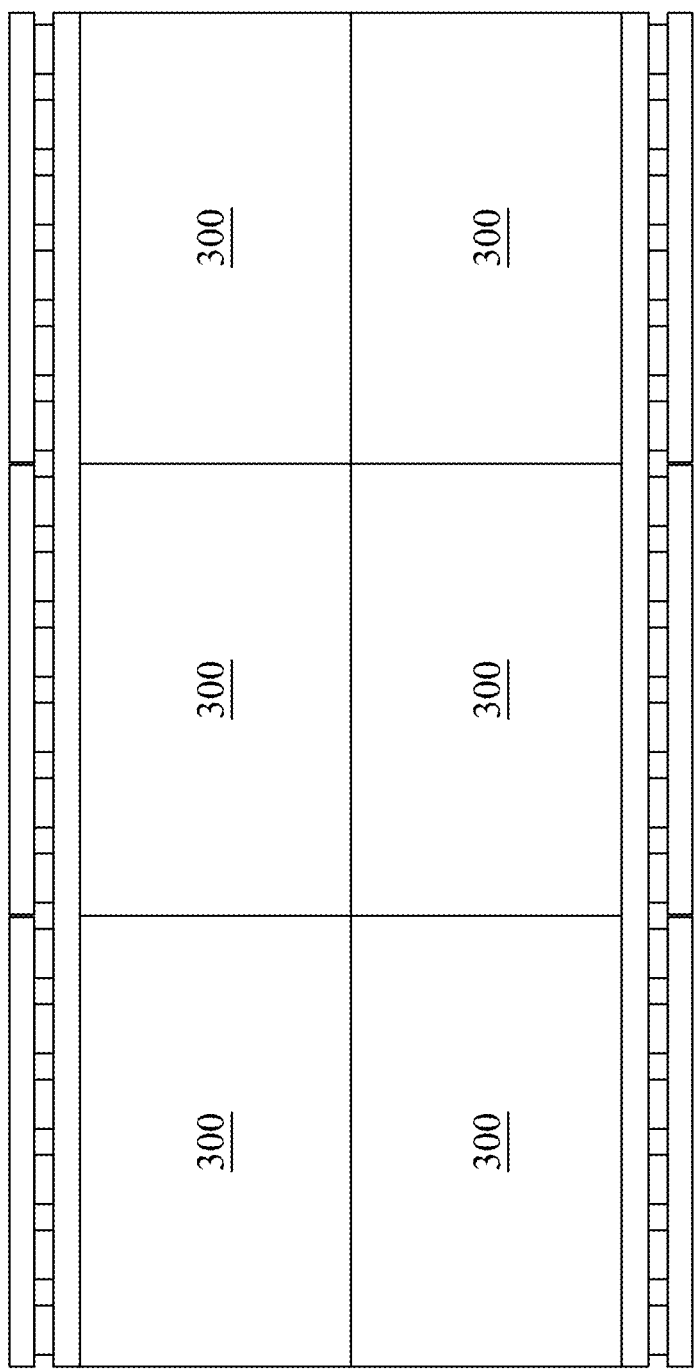
FIG. 13 is a top view of a spliced display according to another embodiment of the present disclosure.
Figure 14:
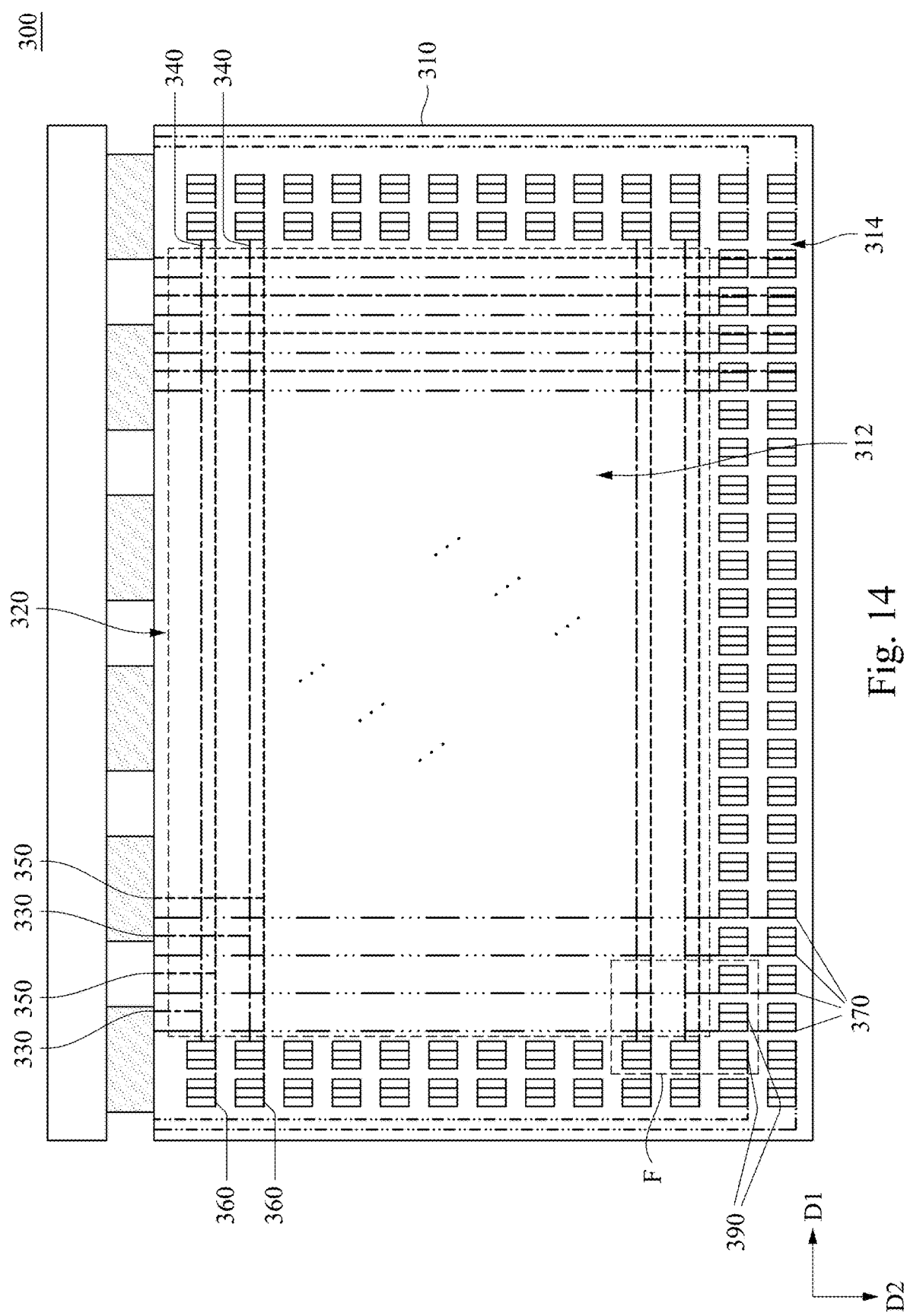
FIG. 14 is a top view of the display panel of FIG. 13.

FIG. 13 is a top view of a spliced display 400 according to another embodiment of the present disclosure. FIG. 14 is a top view of the display panel 300 of FIG. 13. Refer to FIG. 13 and FIG. 14, the display panel 300 can be one of the display panels of the spliced display 400. The number of the display panel 300 in FIG. 1 is merely an example, and it is not used to limit the disclosure. The display panel 300 includes a substrate 310, a circuit routing area 320, a plurality of first gate lines 330, a plurality of second gate lines 340, a plurality of first drive lines 350, a plurality of second drive lines 360 and a plurality of third drive lines 370. The substrate 310 has a liquid crystal display area 312 and a LED display area 314, in which a plurality of pixels 390 consist of LEDs are disposed in the LED display area 314. The LED display area 314 surrounds the liquid crystal display area 312. The circuit routing area 320 is adjacent to a first side 314a of the LED display area 314 of the substrate 310. The first gate lines 330 are located in the liquid crystal display area 312, arranged along a first direction D1 and electrically connected to the circuit routing area 320. The second gate lines 340 pass through the liquid crystal display area 312, are arranged along a second direction D2, the second direction D2 is different from the first direction D1, in which each of the second gate lines 340 electrically connects one of the first gate lines 330. The first drive lines 350 are located in the liquid crystal display area 312, arranged along the first direction D1 and electrically connected to the circuit routing area 320. The second drive lines 360 pass through the liquid crystal display area 312, are arranged along the second direction D2, in which each of the second drive lines 360 electrically connects one of the first drive lines 350. The third drive lines 370 are located in the liquid crystal display area 312, arranged along the first direction D1. In the following description, the first gate lines 330, the second gate lines 340, the first drive lines 350, second drive lines 360 and the third drive lines 370 are described.

Figure 15:
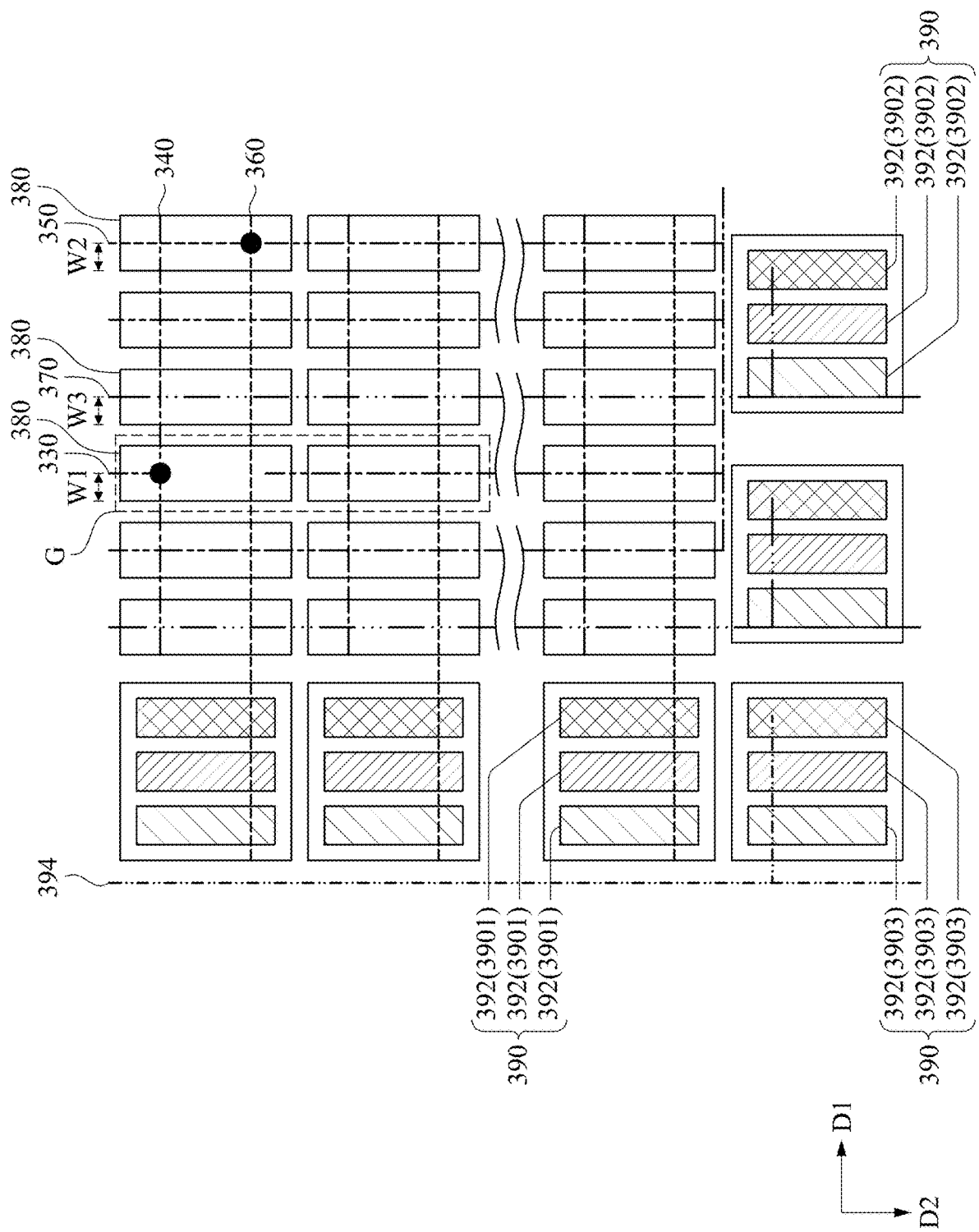
FIG. 15 is a local enlarged view of the range confined by the dashed line F of the display panel of FIG. 14.
Figure 16:
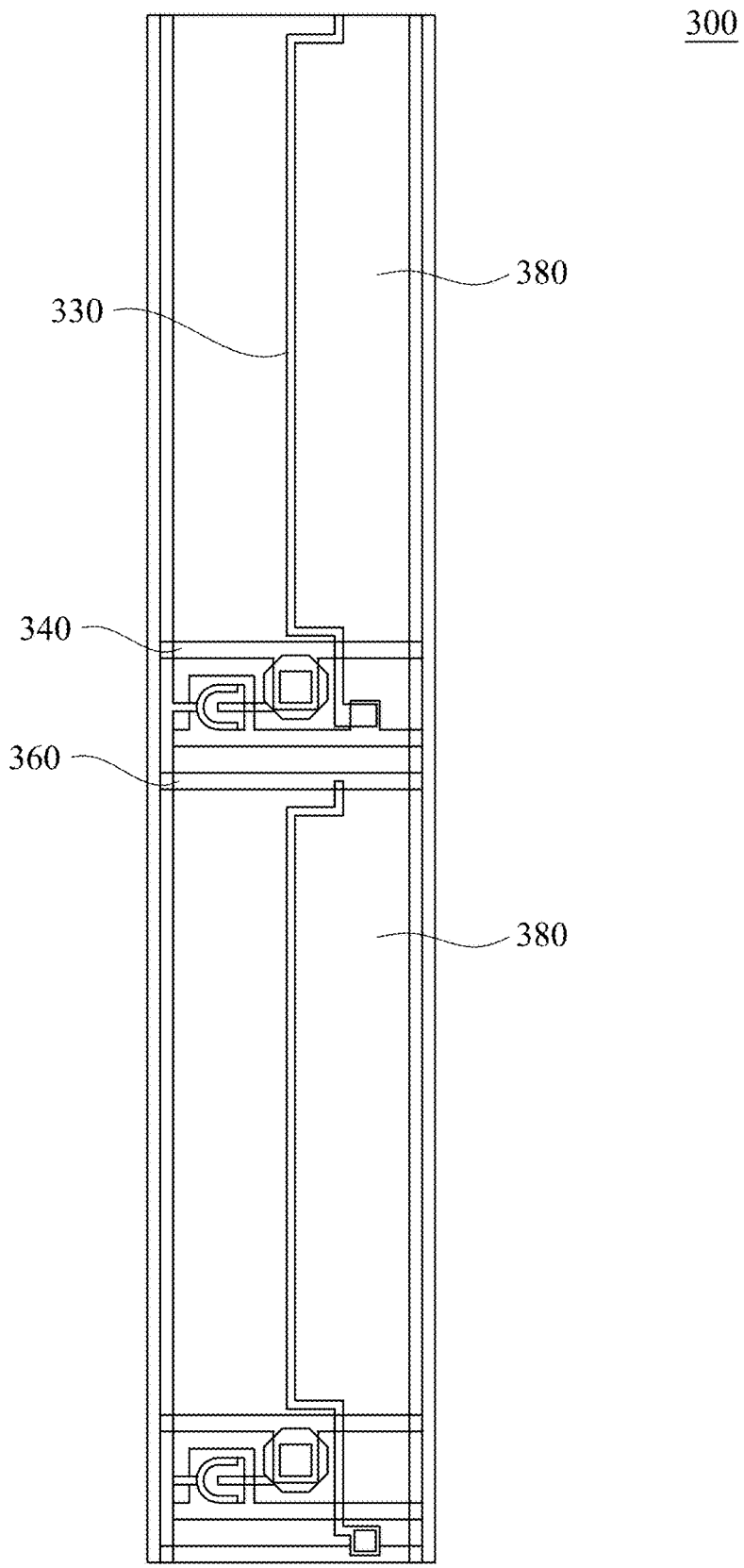
FIG. 16 is a local enlarged view of the range confined by the dashed line G of the display panel of FIG. 15.

FIG. 15 is a local enlarged view of the range confined by the dashed line F of the display panel 300 of FIG. 14. FIG. 16 is a local enlarged view of the range confined by the dashed line G of the display panel 300 of FIG. 15. Refer to FIG. 15 and FIG. 16, the display panel 300 further includes a plurality of liquid crystal subpixels 380. The liquid crystal subpixels 380 are located in the liquid crystal display area 312 (see FIG. 14) of the substrate 310. The second drive lines 360 electrically connect a first portion 3901 of the LEDs 392 (such as the LEDs 392 located at the left side of FIG. 15). The third drive lines 370 electrically connect a second portion 3902 of the LEDs 392 (such as the LEDs 392 located at the bottom side of FIG. 15). Moreover, every of the third drive lines 370 is located between one of the first gate lines 330 and one of the first drive lines 350. Moreover, a first distance W1 is between each of the third drive lines 370 and a left boarder of one of the liquid crystal subpixel 380 that is closest to a position of the third drive line 370, a second distance W2 is between each of the first drive lines 350 and a left boarder of one of the liquid crystal subpixel 380 that is closest to a position of the first drive line 350, a third distance W3 is between each of the first gate lines 330 and a left boarder of one of the liquid crystal subpixel 380 that is closest to a position of the first gate line 330, and the first distance, the second distance and the third distance are all smaller than a width of the liquid crystal subpixel 380 on the first direction D1, and they can be the same. As an example, the first distance W1, the second distance W2 and the third distance W3 is half of the width of every of the liquid crystal subpixel 380 on the first direction D1. Moreover, the display panel 300 further includes a plurality of fourth drive lines 394. The fourth drive lines 394 are located in the LED display area 314 (see FIG. 14) and electrically connected to the circuit routing area 320 and a third portion 3903 of the LEDs 392 (such as the LEDs 392 located at the lower left of FIG. 15). Since there are two columns of pixels 390 consist of LEDs 392 on each side respectively and three LEDs 392 combine into a pixel 390, each of the second drive lines 360 electrically connects and drives LEDs 392 on two sides. In practical application, to increase the aperture ratio of the liquid crystal subpixel 380, the first gate lines 330 and the first drive lines 350 will located under the trunk black area of the polymer sustained alignment (PSA) of the liquid crystal subpixel 380.

Figure 17:
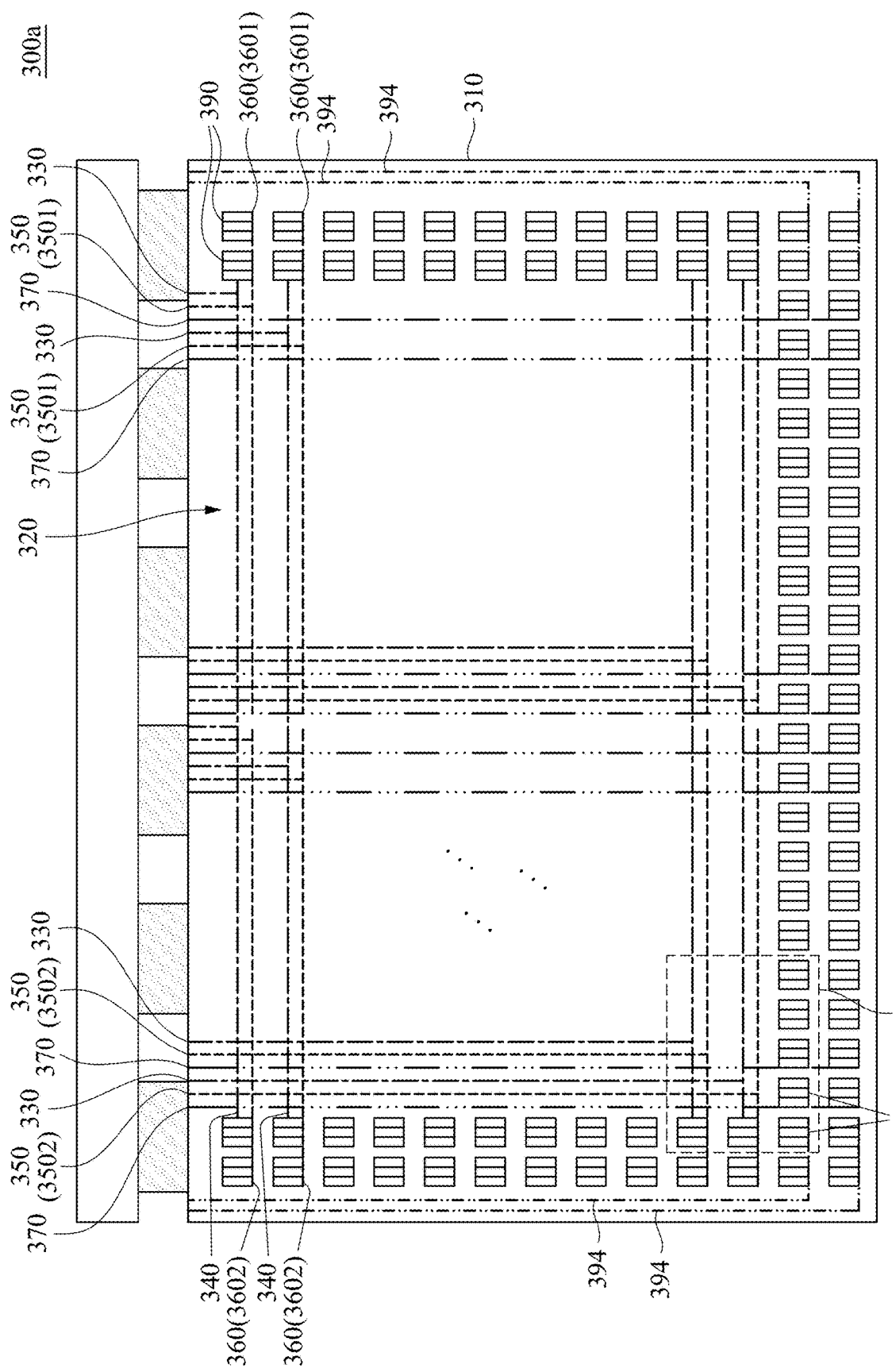
FIG. 17 is a top view of the display panel according to yet another embodiment of the present disclosure.
Figure 18:
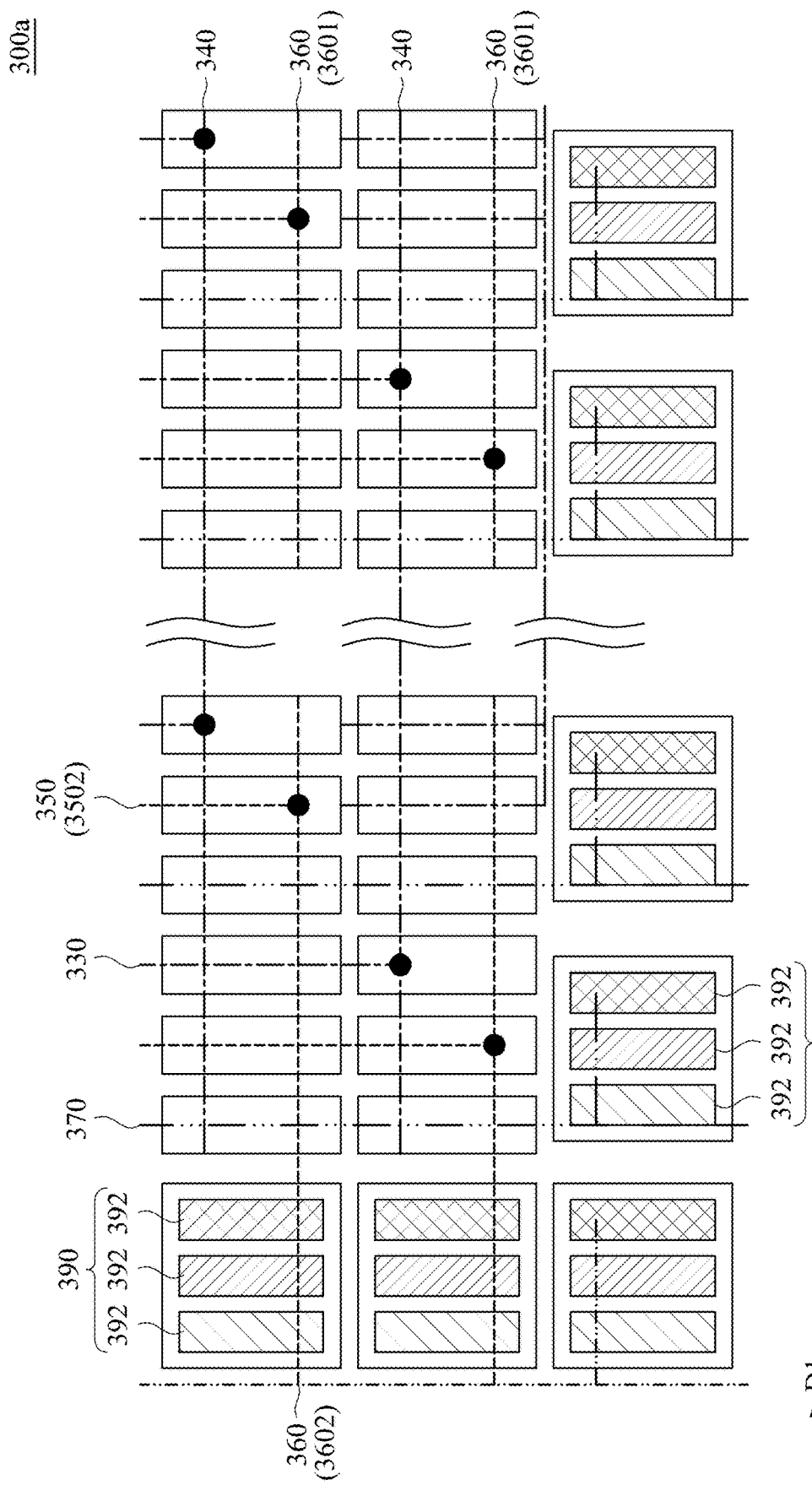
FIG. 18 is a local enlarged view of the range confined by the dashed line H of the display panel of FIG. 17.

FIG. 17 is a top view of the display panel 300a according to yet another embodiment of the present disclosure. FIG. 18 is a local enlarged view of the range confined by the dashed line H of the display panel 300a of FIG. 17. Refer to FIG. 17 and FIG. 18, a display panel 300a includes a substrate 310, a circuit routing area 320, a plurality of first gate lines 330, a plurality of second gate lines 340, a plurality of first drive lines 350, a plurality of second drive lines 360 and a plurality of third drive lines 370. The difference between the present embodiment and the embodiment of FIG. 14 is that, in the present embodiment, the first drive line 350 has a first portion 3501 and a second portion 3502, the second drive line 360 has a first portion 3601 and a second portion 3602, every of the first portion 3501 of the first drive line 350 electrically connects one of the first portion 3601 of the second drive line 360 and two of the pixels 390 consist of the LEDs 392 (i.e. six LEDs 392).

Figure 19:
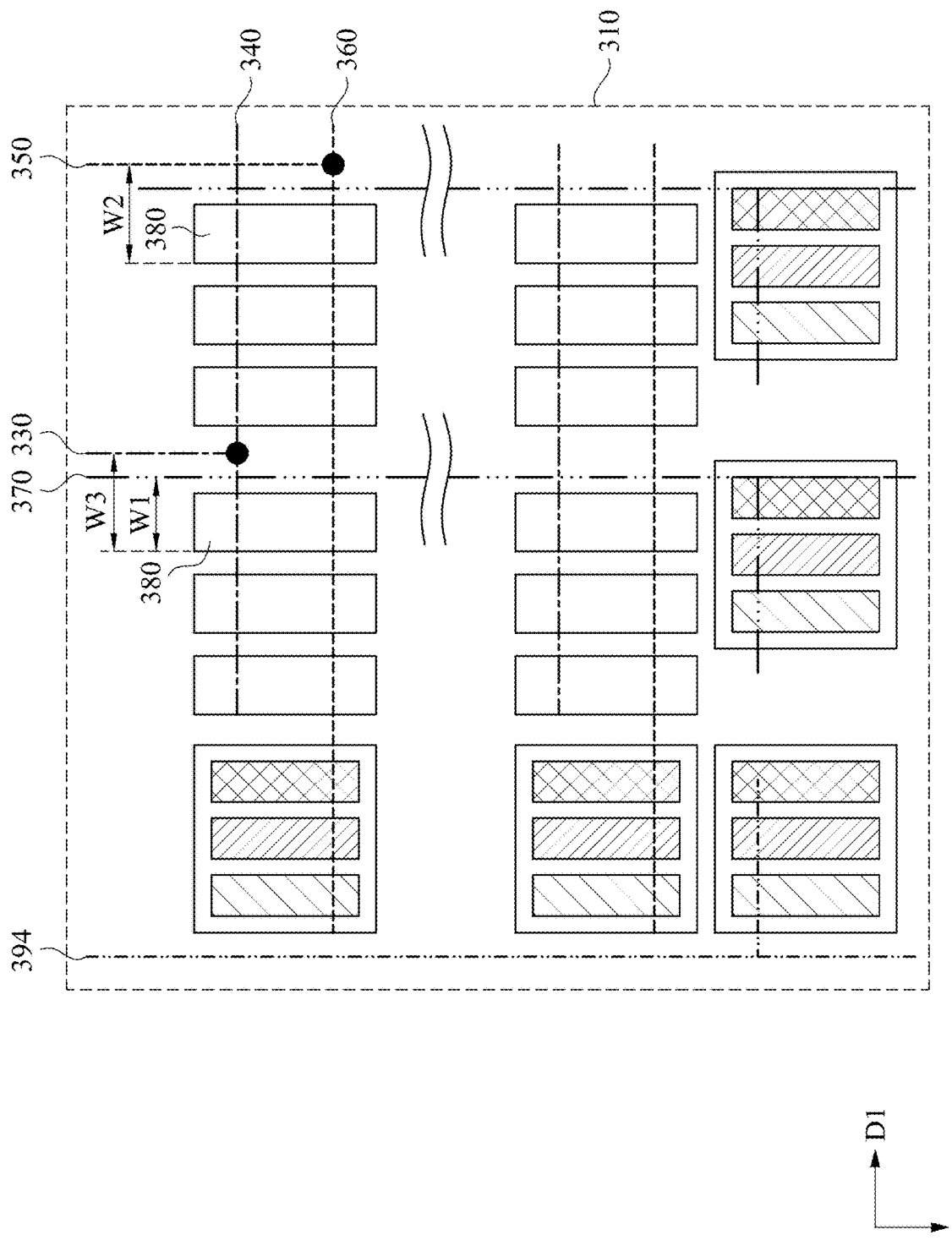
FIG. 19 is a top view of the display panel according to yet another embodiment of the present disclosure.

FIG. 19 is a top view of the display panel 300b according to yet another embodiment of the present disclosure. Refer to FIG. 19, a display panel 300b includes a substrate 310, a plurality of first gate lines 330, a plurality of second gate lines 340, a plurality of first drive lines 350, a plurality of second drive lines 360 and a plurality of third drive lines 370. The difference between the present embodiment and the embodiment of FIG. 14 is that, in the present embodiment, a first distance W1 is between each of the third drive lines 370 and a left boarder of one of the liquid crystal subpixel 380 that is closest to a position of the third drive line 370, a second distance W2 is between each of the first drive lines 350 and a left boarder of one of the liquid crystal subpixel 380 that is closest to a position of the first drive line 350, a third distance W3 is between each of the first gate lines 330 and a left boarder of one of the liquid crystal subpixel 380 that is closest to a position of the first gate line 330, and the first distance W1, the second distance W2 and the third distance W3 are all greater than a width of the liquid crystal subpixel 380 on the first direction D1. The second distance W2 and the third distance W3 are roughly the same, and the first distance W1 is smaller than the third distance W3.

Figure 20:
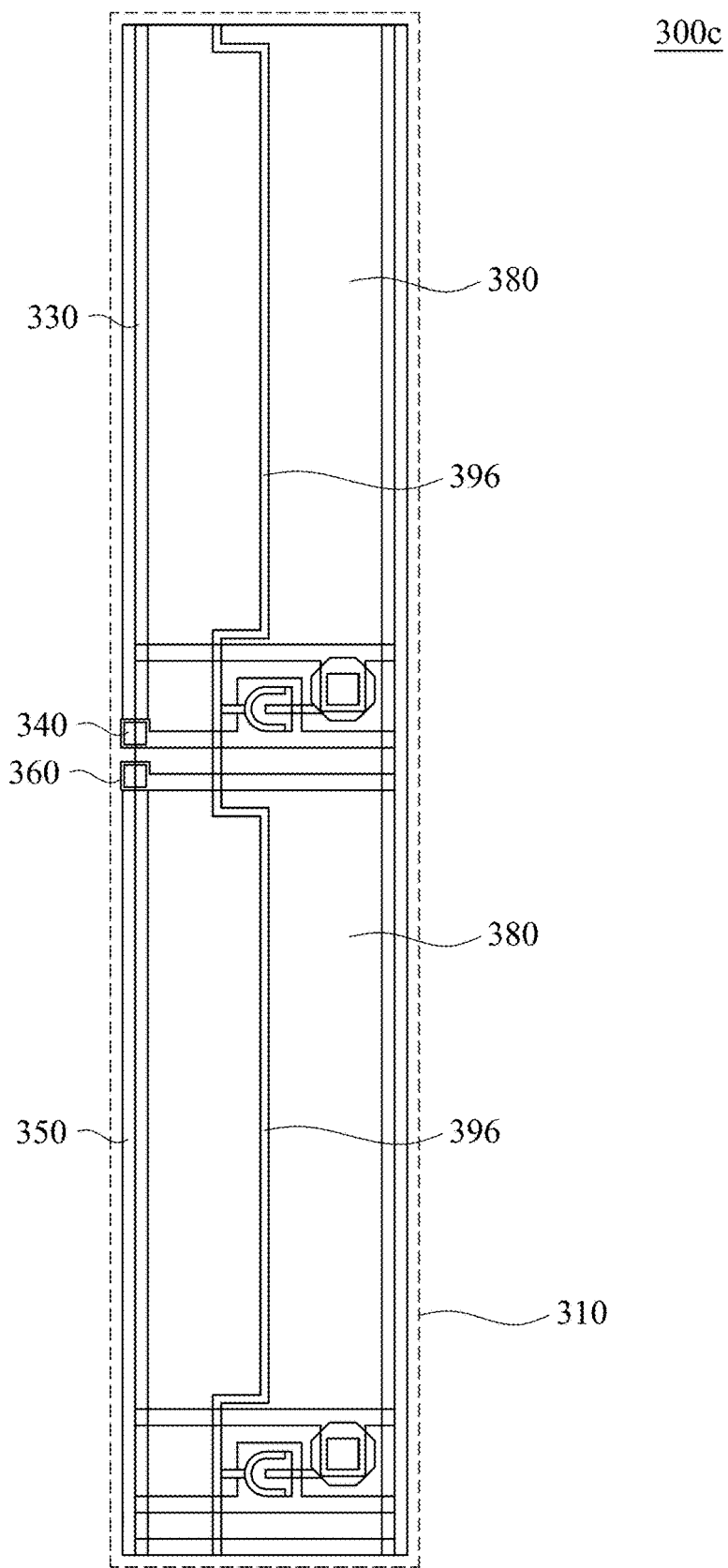
FIG. 20 is a local enlarged view of the liquid crystal subpixels of the display panel according to yet another embodiment of the present disclosure.

FIG. 20 is a local enlarged view of the liquid crystal subpixels 380 of the display panel 300c according to yet another embodiment of the present disclosure. Refer to FIG. 20, a display panel 300c includes a plurality of first gate lines 330, a plurality of second gate lines 340, a plurality of first drive lines 350 and a plurality of liquid crystal subpixels 380. The difference between the present embodiment and the embodiment of FIG. 16 is that, in the present embodiment, the display panel 300c further includes a plurality of data lines 396. The data lines 396 are located between the liquid crystal subpixels 380 and the substrate 310, in which the data lines 396 extend along a center line of the liquid crystal subpixels 380.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display panel, comprising:
   a substrate having a liquid crystal display area and a LED display area, wherein a plurality of light emitting diodes (LED) are disposed in the LED display area, the liquid crystal display area is disposed with a plurality of liquid crystal subpixels and three of the liquid crystal subpixels form a pixel;
   a first circuit routing area adjacent to a first side of the LED display area of the substrate;
   a second circuit routing area adjacent to a second side opposite to the first side of the LED display area of the substrate;
   a plurality of first gate lines arranged along a first direction and electrically connected to the first circuit routing area or the second circuit routing area;
   a plurality of second gate lines arranged along a second direction, wherein the second direction is different than the first direction, each of the first gate lines and one of the second gate lines intersect at a first intersect point, each of the second gate lines electrically connects one of the first gate lines;
   a plurality of first drive lines arranged along the first direction and electrically connected to the first circuit routing area or the second circuit routing area and the LEDs; and
   a plurality of second drive lines arranged along the second direction, wherein each of the second drive lines electrically connects one of the first drive lines, each of the first drive lines and one of the second drive lines electrically connects at a second intersect point, a distance between one of the first intersect points and one of the second intersect points on the first direction is smaller than a width of the liquid crystal subpixel on the first direction, or a distance between two of the second intersect points on the first direction is smaller than a width of the liquid crystal subpixel on the first direction.

2. The display panel of claim 1, wherein a distance on the first direction between every of the second intersect points and one of the first intersect points on the first direction respectively is smaller than a width of the liquid crystal subpixel on the first direction.

3. The display panel of claim 2, wherein the first drive lines has a first portion and a second portion, the second drive lines has a first portion and a second portion, each of the first portion of the first drive lines electrically connects one of the first portion of the second drive lines and the LEDs on a side in a same row.

4. The display panel of claim 1, wherein a distance on the first direction between every of the second intersect point and another one of the second intersect point on the first direction is smaller than a width of the liquid crystal subpixel on the first direction.

5. The display panel of claim 4, wherein the first drive lines has a first portion and a second portion, the second drive lines has a first portion and a second portion, the first portion of the second drive lines electrically connects the first circuit routing area through the first portion of the first drive lines, and the second portion of the second drive lines electrically connects the second circuit routing area through the second portion of the first drive lines.

6. The display panel of claim 4, wherein a width between each of the first intersect point and another one of the first intersect point respectively on the first direction is smaller than the width of the liquid crystal subpixel on the first direction.

7. The display panel of claim 1, wherein the first gate lines and the first drive lines are located between the pixels.

8. The display panel of claim 7, further comprising:
a plurality of data lines located between the liquid crystal subpixels and the substrate, wherein the data lines extend along a center line of the liquid crystal subpixels.

9. A display panel, comprising:
a substrate having a liquid crystal display area and a LED display area, wherein a plurality of light emitting diodes (LED) are disposed in the LED display area, the LED display area surrounds the liquid crystal display area;
a plurality of liquid crystal subpixels located in the liquid crystal display area of the substrate;
a circuit routing area adjacent to a first side of the LED display area of the substrate;
a plurality of first gate lines located in the liquid crystal display area, arranged along a first direction and electrically connected to the circuit routing area;
a plurality of second gate lines passing through the liquid crystal display area, arranged along a second direction, wherein the second direction is different from the first direction, each of the second gate lines electrically connects one of the first gate lines;
a plurality of first drive lines located in the liquid crystal display area, arranged along the first direction and electrically connected to the circuit routing area;
a plurality of second drive lines passing through the liquid crystal display area, arranged along the second direction and electrically connected to a first portion of the LEDs, wherein each of the second drive lines electrically connects one of the first drive lines; and
a plurality of third drive lines located in the liquid crystal display area, arranged along the first direction and electrically connected to a second portion of the LEDs, wherein a first distance is between each of the third drive lines and a left boarder of one of the liquid crystal subpixel that is closest to a position of the third drive line, a second distance is between each of the first drive lines and a left boarder of one of the liquid crystal subpixel that is closest to a position of the first drive line, a third distance is between each of the first gate lines and a left boarder of one of the liquid crystal subpixel that is closest to a position of the first gate line, and the first distance, the second distance and the third distance are all greater or smaller than a width of every of the liquid crystal subpixel on the first direction.

10. The display panel of claim 9, wherein the first distance, the second distance and the third distance is half of the width of every of the liquid crystal subpixel on the first direction.

11. The display panel of claim 10, wherein every of the third drive lines is located between one of the first gate lines and one of the first drive lines.

12. The display panel of claim 10, wherein the first drive line has a first portion and a second portion, the second drive line has a first portion and a second portion, every of the first portion of the first drive line electrically connects one of the first portion of the second drive line and the LEDs on a side in a same row.

13. The display panel of claim 9, wherein the second distance is the same as the third distance, and the first distance is smaller than the third distance.

14. The display panel of claim 9, further comprising
a plurality of data lines located between the liquid crystal subpixels and the substrate, wherein the data lines extend along a center line of the liquid crystal subpixels.

15. The display panel of claim 9, further comprising
a plurality of fourth drive lines located in the LED display area and electrically connected to the circuit routing area and a third portion of the LEDs.

* * * * *